United States Patent [19]

Potter et al.

[11] Patent Number: 5,183,529
[45] Date of Patent: Feb. 2, 1993

[54] FABRICATION OF POLYCRYSTALLINE FREE-STANDING DIAMOND FILMS

[75] Inventors: Timothy J. Potter, Dearborn, Mich.; Michael A. Tamor, Toledo, Ohio; Ching-Hsong Wu, Farmington Hills, Mich.

[73] Assignee: Ford Motor Company, Dearborn, Mich.

[21] Appl. No.: 604,692

[22] Filed: Oct. 29, 1990

[51] Int. Cl.⁵ .............................................. C30B 25/00
[52] U.S. Cl. .......................... 156/613; 148/DIG. 107; 156/DIG. 68; 156/DIG. 88; 264/81; 264/234; 423/446; 423/461; 427/226; 427/249; 427/577; 427/585; 437/925; 437/946; 437/966
[58] Field of Search ....... 156/613, DIG. 68, DIG. 88; 264/81, 234; 148/DIG. 107; 423/446, 461; 437/925, 946, 966, 974; 427/226, 38, 249

[56] References Cited

U.S. PATENT DOCUMENTS

| | | |
|---|---|---|
| 4,250,148 | 2/1981 | Cota et al. . |
| 4,303,463 | 12/1981 | Cook ................................. 156/603 |
| 4,308,028 | 12/1981 | Cook ................................. 148/1.5 |
| 4,323,419 | 4/1982 | Wakefield ......................... 156/622 |
| 4,345,967 | 8/1982 | Cook ................................. 156/613 |
| 4,434,188 | 2/1984 | Kamo et al. . |
| 4,490,229 | 12/1984 | Mirtich et al. . |
| 4,537,651 | 8/1985 | Shuskus et al. . |
| 4,740,263 | 4/1988 | Imai et al. . |
| 4,816,286 | 3/1989 | Hirose . |
| 4,935,303 | 6/1990 | Ikoma et al. ......................... 427/38 |

FOREIGN PATENT DOCUMENTS

| | | | |
|---|---|---|---|
| 1-111707 | 4/1989 | Japan | ................................. 423/446 |
| 2-160695 | 6/1990 | Japan | .......................... 156/DIG. 68 |

Primary Examiner—Robert Kunemund
Assistant Examiner—Felisa Garrett
Attorney, Agent, or Firm—Joseph W. Malleck; Roger L. May

[57] ABSTRACT

Method of fabricating free-standing diamond films by depositing and adhering polycrystalline diamond by hot filament chemical vapor deposition (1-100 Torr, filament temperature equal to or greater than 1900° C., substrate temperature of 650°-950° C.) onto a substrate meltable at a temperature slightly in excess of the deposition temperature; and (b) prior to cooling said polycrystalline diamond particles, increasing (50°-300° C.) the substrate temperature to melt at least a portion thereof while permitting such melt to emigrate from the diamond films.

11 Claims, 3 Drawing Sheets

FABRICATION OF POLYCRYSTALLINE FREE-STANDING DIAMOND FILMS

BACKGROUND OF THE INVENTION

1. Technical Field

This invention relates to the technology of making diamond crystals, and more particularly to the art of making diamond films of such crystals in a free-standing condition.

2. Discussion of the Prior Art

The growth of diamond crystals, particularly thin films, from a vapor phase has been tried according to several types of methods as delineated in U.S. Pat. No. 4,740,263. One of the most effective methods is that of chemical vapor deposition which comprises activating a gaseous mixture of a carbon containing gas mixture, usually methane and hydrogen, the activation being by a variety of mechanisms such as microwave discharge (see U.S. Pat. No. 4,434,188), by dual ion beam activation of a methane/argon mixture (see U.S. Pat. No. 4,490,229), by use of a hot filament which may be comprised of tungsten (see U.S. Pat. No. 4,740,263), or by any variety of thermal techniques using heat, electron beam, light, DC discharge, AC glow discharge, DC arc discharge, to excite a gas containing an organic compound (see U.S. Pat. No. 4,816,286). The substrates for deposition of diamond films have usually been quartz and silicon. None of these techniques directly produce a free-standing diamond film because of its adherence to the substrate which is important to the nucleation process of the diamond film.

To obtain a free-standing diamond film, the prior art has conventionally turned to slicing of bulk diamond crystals (natural or synthetic) which has proved to be costly and difficult, especially for thin films. The mechanical stress of such cutting as well as the induced thermal effects, cause stress which leads to cracking or shattering of the diamond crystals.

Another technique used by the prior art to obtain a free-standing film is that of extensive chemical/physical etching of silicon substrates after the chemical vapor deposition process is completed. Essentially, the film and substrate are tipped over and the substrate removed by application of a strong acid which etches away the silicon substrate over an extremely long period of time. This process is complicated and time-consuming, and subjects the diamond film to thermal stress which leads to cracking or shattering.

Although the above represents known techniques for removing diamond from substrates upon which they have been deposited, there has been some attempt by the prior art to remove substrates from nondiamond films. In U.S. Pat. No. 4,250,148, silicon ribbons, deposited on metal foil, were separated by stress developed after cooling; in U.S. Pat. No. 4,537,651, a germanium semiconductor material was deposited on a salt (sodium chloride) substrate, which substrate was melted by an electron beam and the molten salt drawn away by the capillary action of another wettable material (such as a tungsten support). Such techniques for nondiamond films have traditionally held out little hope with respect to diamond films which must be deposited on substrates which withstand chemical vapor at the extremely high temperatures of the deposition process itself and therefore are not readily removed at temperatures below which diamond is converted to graphite (1000°–1200° C.).

The invention is a method of fabricating free-standing diamond films for a large variety of applications, but is of particular interest to the automotive industry where ultra-thin diamond films may have potential use in finishes for chip resistance and in windshield coatings to prevent grit streaking from wipers. The method comprises (a) depositing and adhering diamond particles by hot filament chemical vapor deposition onto a substrate selected to be meltable at a temperature slightly in excess of the temperature of the substrate during deposition; and (b) prior to cooling said diamond particles, increasing the substrate temperature to melt at least a portion of the substrate while permitting such melt to emigrate from the diamond particles.

It is preferable to utilize a small diameter hot filament (about 0.0010") which is particularly comprised of tantalum or rhenium to facilitate such small diameter filaments; with such small diameter filament, deposition can be carried out at higher rates and with little destructive radiation effects upon the substrate or diamond film, the rates being in the range of 2–5 microns per hour.

Preferably, the parameters of the hot filament chemical vapor deposition comprise evacuating the deposition chamber to 1–100 Torr, activating the filament by an AC current without electrical bias to a temperature greater than 1900° C., separately but simultaneously heating the substrate to a temperature in the range of 600°–950° C., flowing a carbon carrying gas mixture through the chamber at a rate of about 100–200 sccm, selecting the carbon carrying gas mixture to consist of virtually any hydrocarbon (typically methane, acetylene, or methanol) in combination with hydrogen gas, the hydrocarbon constituting 0.2–2% by volume of the gas mixture along with a limited amount of carbon monoxide to favorably suppress the formation of graphite (the CO being limited to restrict the oxygen/carbon ratio to 0.5–1.0), and, lastly, the time period for the chemical vapor deposition being adjusted to obtain the desired film thickness given the deposition determined by the conditions described.

Preferably, the substrate is a material that has a melting point about 50°–300° C. in excess of the deposition temperature during hot filament chemical vapor deposition. Such substrate is preferably selected from the group consisting of copper, gold, beryllium, manganese, Al/Fe, Al/Cu, and Ni/Sn, and nonmetals consisting of $Al_2F_3$, $CdF_2$, or $CrF_2$. Preferably, the period for melting the substrate is in the range of five minutes to two hours and the melt is emigrated either by tilting the substrate and allowing it to drain by gravity or by absorbing the melt into a support screen therebelow.

A second aspect of this invention is to continuously form a ribbon of free-standing diamond film, the method comprising: (a) rotating a metallic drum constituted of a metal having a melting temperature greater than the melting temperature of the substrate for diamond deposition; (b) introducing molten substrate material to be carried by the rotating drum outer surface at a first position about the drum axis, the substrate material being meltable at a temperature slightly in excess of its temperature during deposition of the diamond crystals; (c) at a second location about such axis, where the substrate material has solidified thereon, depositing polycrystalline diamond particles by hot filament chemical vapor deposition while heating the drum in the region of such deposition to promote crystallization; and (d) at a third location about the axis, where the deposited polycrystalline diamond particles have merged to form a continuous film adhered to the solid substrate material, heating the substrate to at least its melting temperature, facilitating disadherence of the substrate material from the polycrystalline diamond film and permitting the diamond film to separate from the coated drum as a continuous diamond ribbon. If necessary, such continuous method may utilize a mechanical tongue to encourage the separation of the ribbon from the drum and the drum itself is contoured with a peripheral trough in its outer surface to contain the molten substrate material during the rotation of the drum. The surface tension inherent to the molten substrate material may be sufficient that it will remain as a liquid film on the drum, thus eliminating the need for collection and recirculation of the material.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION AND BEST MODE

Figure 1:
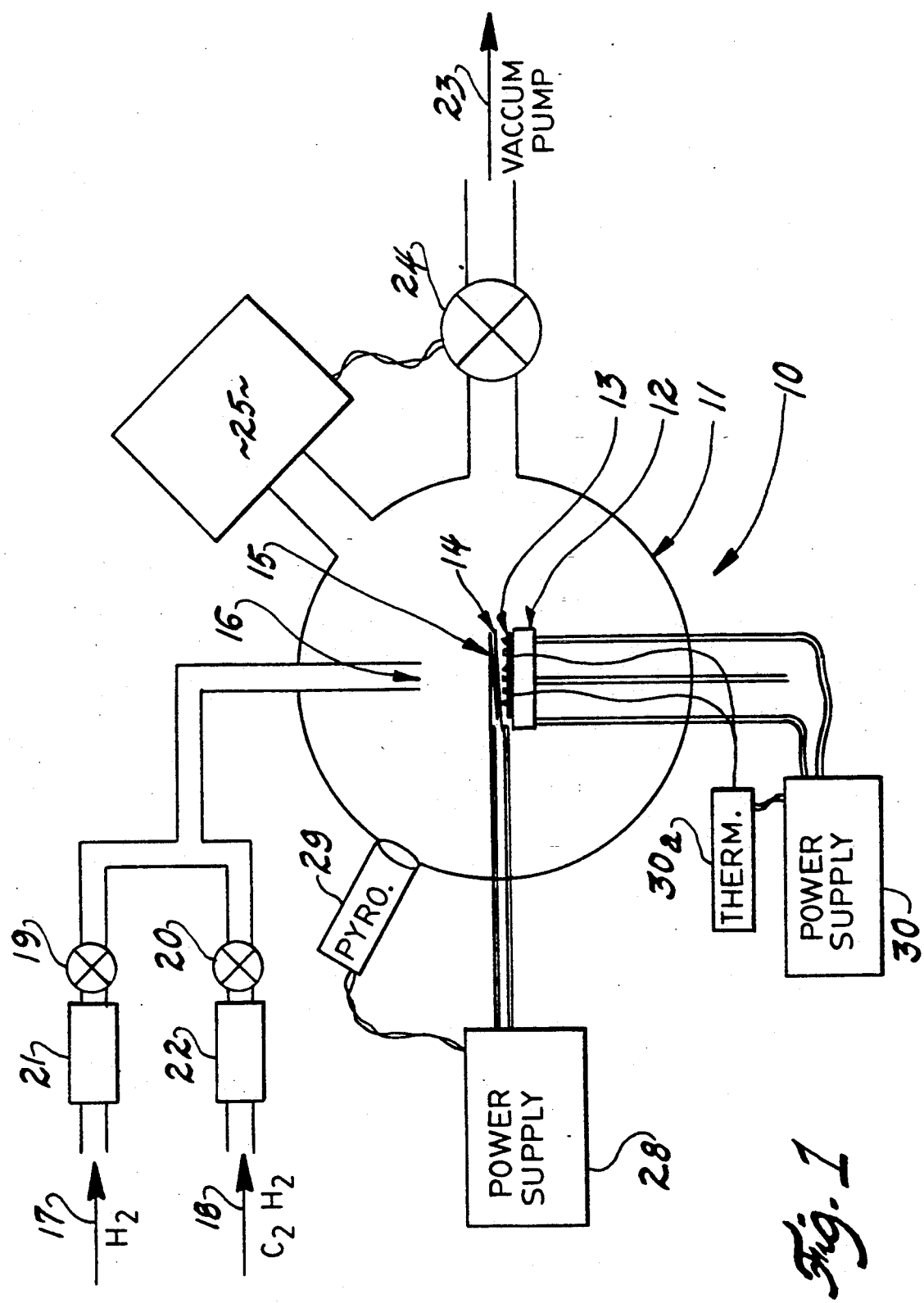
FIG. 1 is a schematic illustration of the overall apparatus used to carry out the method of this invention relating to batch deposition.

As shown in FIG. 1, an apparatus for carrying out this invention in a batch mode includes a reactor assembly 10 having a reaction chamber 11 within which is positioned a heater component 12 effective to act as a support for a substrate 13 upon which diamond films 14 are to be deposited. In the chamber is a filament 15 effective to activate the gaseous mixture which is introduced to the chamber 11 surrounding the substrate and filament. The gas mixture is introduced preferably by a common inlet 16 which draws pure hydrogen from a cylinder 17 and a carbon carrying gas in $H_2$ from a cylinder 18. The carbon carrying gas may be methane, acetylene, or methanol and is restricted to a percentage of about 0.2–2.0% by volume of the mixture. The gases flow from their cylinders and are admitted by way of on-off valves 19, 20 and electronic mass flow controllers 21, 22 which regulate the flow to a desired flow rate, which is in the range of 0–200 sccm. The pressure of the reaction chamber is controlled by use of a vacuum pump 23 which is in turn controlled by use of a pressure control valve 24 operated in response to the degree of vacuum indicated by the gage. The pressure is preferably maintained within the range of 1–100 Torr and optimally is regulated to about 50 Torr. The gas mixture additionally will contain a small amount of oxygen compound such as carbon monoxide which is introduced to the mixture in a strictly controlled amount so that the oxygen to carbon ratio is 0.5–1.0.

The conditions for stimulating the nucleation of polycrystalline diamond particles include a temperature for the filament 15 of at least 1900° C., the absence of an electrical bias, a temperature for the substrate 13 in the range of 600°–950° C., and a deposition time in the range of three minutes to four hours depending upon the desired thickness of the diamond particles 14.

The filament 15 itself is preferably of a small diameter wire of about 0.005–0.020 inches and is constituted of tantalum or rhenium permitting long operation lifetimes at high temperature. A small diameter hot filament limits the destructive effects of radiation on the substrate and particles and permits hot filament activation to effect a greater number of gas molecules. Hot filament chemical vapor deposition is desired for this invention because it permits an extremely high rate of diamond deposition in the range of 2–5 microns per hour while facilitating the unique separation concept herein.

The filament 15 is spaced from the substrate a distance within the range of 3/16 inch, plus or minus 1/16 inch. It is supplied with electrical current from a power supply which senses the light emitted by the filament through a pyrometer 29.

The heater 12 supporting the substrate 13 is preferably comprised of a molybdenum metal shell within which is embedded a series of resistance wires (powered from an electrical supply 30 controlled by a temperature control 30a) that will permit the surface temperature and therefore the substrate temperature to be raised to the critical range of 600°–950° C. during chemical vapor deposition. Such heater must also be capable of selectively raising the substrate even further to a range of 50°–300° C. above the deposition temperature of the diamond particles, which is usually in the range of 1000°–1100° C. Raising the temperature of the substrate to this elevated range facilitates the melting of the substrate or at least melting a portion thereof which will quickly separate from the diamond film due to the high thermal expansion difference between the solid diamond film and the fluidized substrate material.

To carry out hot filament chemical vapor deposition within this invention, the substrate 13 must be a material selected with a melting temperature that is slightly in excess of the deposition temperature of the substrate during chemical vapor deposition. This typically will be a material that has a melting point 50°–300° C. in excess of the deposition temperature and thus in the range of 950°–1000° C. Metals which meet this criteria include copper, gold, beryllium, manganese, aluminum/iron, aluminum/copper, nickel/tin, and includes nonmetal such as $Al_2F_3$, $CdF_2$, or $CrF_2$. Each of these materials have high differential thermal expansion characteristics when compared to diamond particles. Each of these materials are also stable at the chemical vapor deposition temperature.

The support for the substrate is a material that has a melting temperature in excess of those of the substrates used and is preferably molybdenum.

The method for carrying out the steps with the apparatus in FIG. 1, comprise: (a) depositing adhering polycrystalline diamond Particles by hot filament chemical vapor deposition onto a substrate, the substrate being meltable at a temperature slightly in excess of the temperature of the substrate attained during chemical vapor deposition; and (b) prior to cooling the diamond films, increasing the temperature of the substrate to melt at least a portion thereof while permitting the melt to emigrate from the diamond films.

Figure 2:
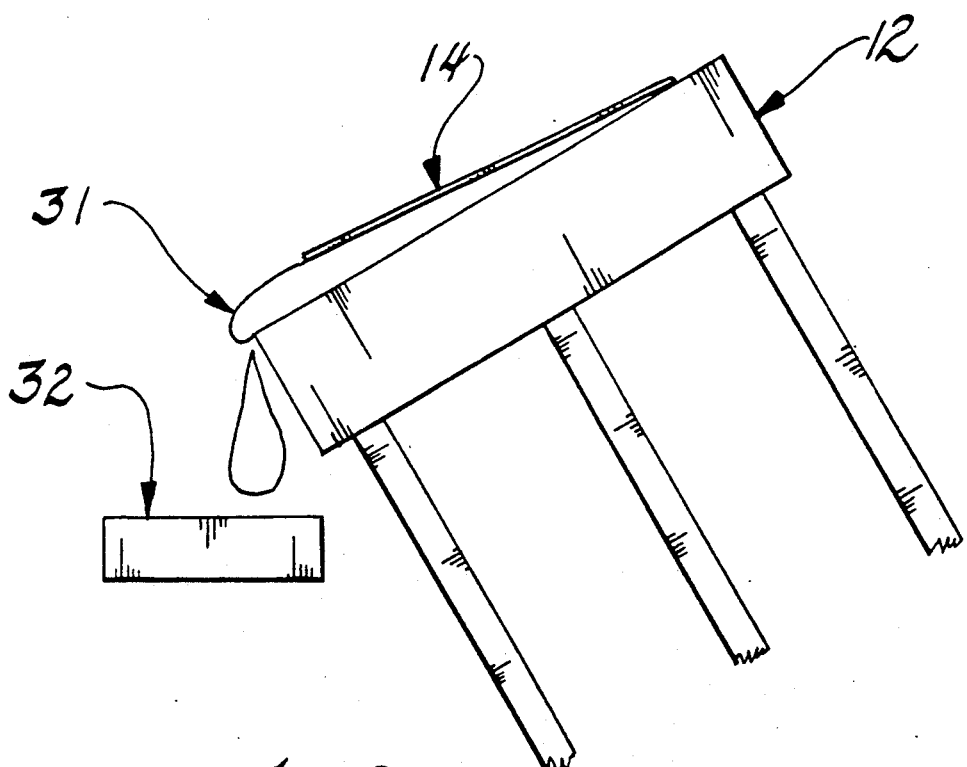
FIG. 2 is a schematic illustration of a heated substrate during the melting step using gravity to withdraw the substrate melt.

Emigration may be facilitated by tilting the supporting molybdenum heater, as shown in FIG. 2, an angle 30 of about 30°, allowing the melt 31 to flow to one side and be collected in a trough 32. The polycrystalline diamond film 14 will immediately detach from the melted substrate (i.e., copper) and remain on the heated support 12 resulting in a free-standing film of diamond.

Figure 3:
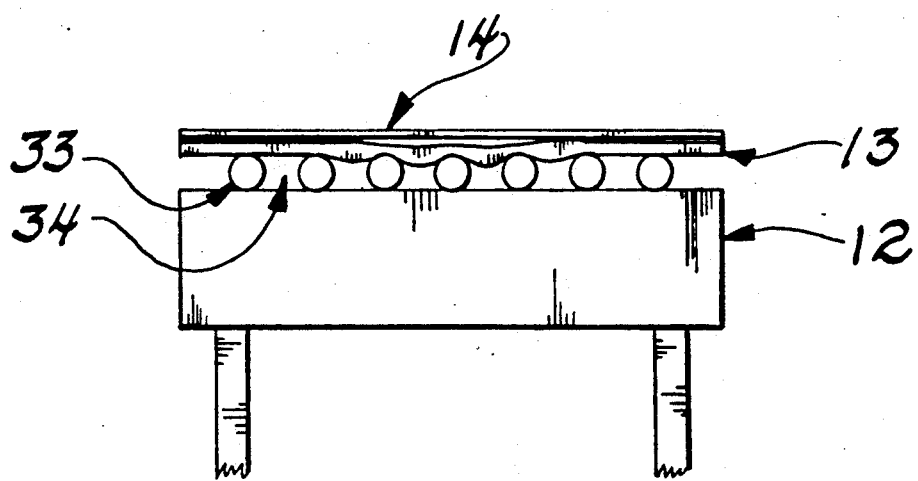
FIG. 3 is an alternative schematic illustration of another mannerism for emigrating the substrate melt using an absorbent mesh.

Alternatively, the support may additionally comprise a molybdenum mesh fabric 33 secured to the top surface of the heater 12, the mesh fabric having a multiple of interstices 34 into which the melted substrate 13 (i.e., copper) emigrates as shown in FIG. 3. In this alternative situation, the entire amount of copper need not be raised to the same high temperature since slight fluidation of the copper will cause it to be absorbed by capillary action into the molybdenum fabric 33.

Continuous Ribbon

Figure 4:
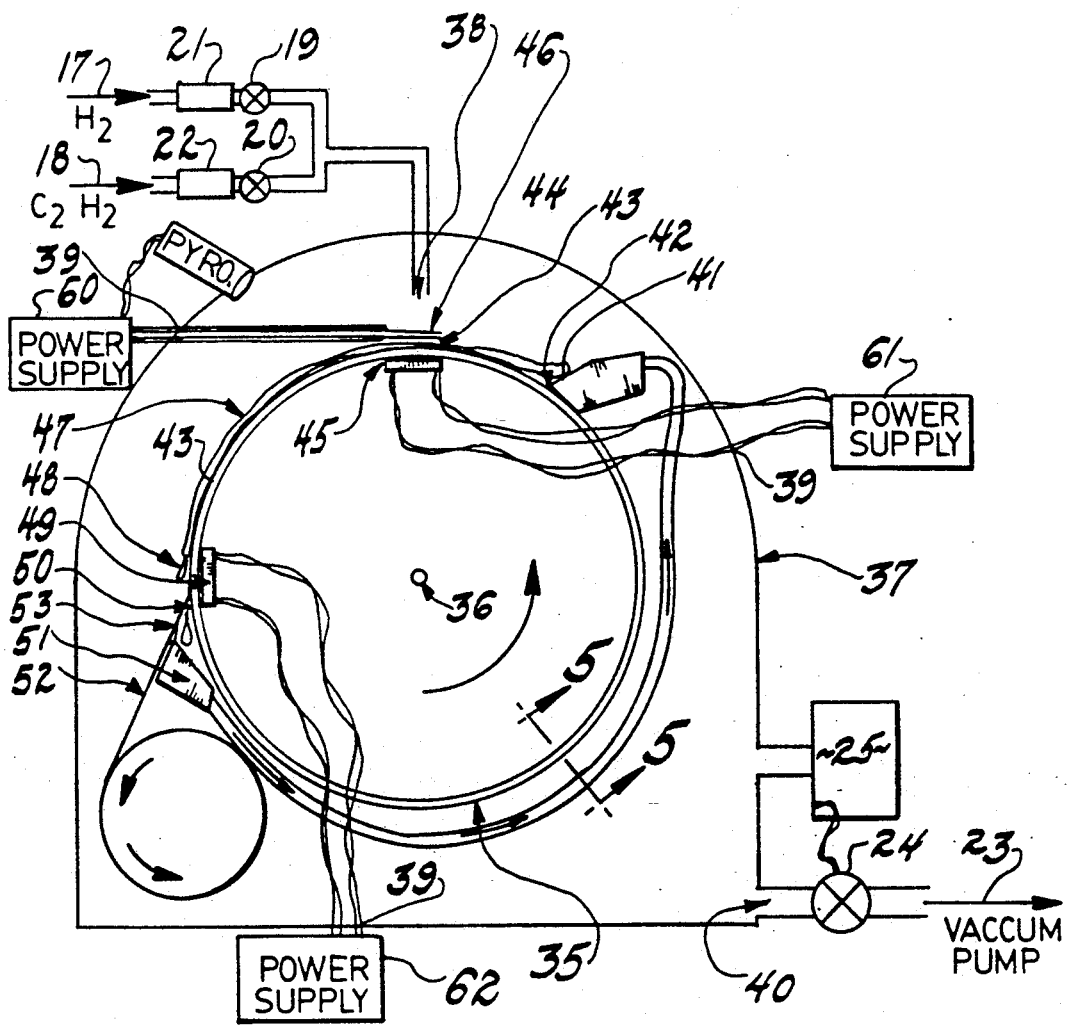
FIG. 4 is a central sectional elevational view of an apparatus for carrying out the continuous aspect of this invention.
Figure 5:
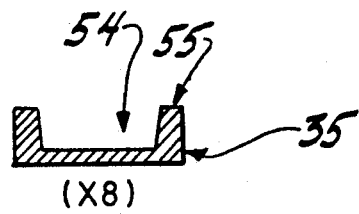
FIG. 5 is a sectional view, taken substantially along line 5—5 of FIG. 4.

As shown in FIGS. 4-5, the apparatus may be alternatively constructed to possess a metallic drum 35 rotatable about an axis 36, the drum being constituted of a metal having a melting temperature in excess of the substrate material itself (such as molybdenum). The drum is supported for rotation within a closed treatment chamber 37 which has an inlet 38 for introducing a carbon carrying gaseous mixture, ports 39 for the admittance of electrical connectors to the various heaters 60, 61, 62 for carrying out the process within the chamber, and a port 40 for evacuating the chamber.

Molten substrate material 41 (such as copper) is introduced such as by being poured from a spout onto the rotating drum at a first position 42 about the drum axis 36, preferably at a two o'clock position as shown in FIG. 4. As the molten copper engages the outer surface of the rotating drum (in the counter-clockwise direction), the copper will be solidified rapidly creating a copper ribbon 43 which is rotated past the chemical vapor deposition station 44 located essentially at a 12 o'clock position with reference to the rotating drum. At this station, a heater 45 (powered by supply 61) beneath the rotating drum raises the temperature of the solidified copper ribbon to a temperature in the range of 900°-1000° C. and the hot filament 46 (powered by supply 60) is energized to its desirable temperature greater than 1900° C. (as in the apparatus embodiment for the batch mode) and is constituted of similar filament material. The gaseous mixture admitted to chamber contains the same type of gas mixture which preferably contains methane acetylene or methanol in an amount of 0.2-2% by volume of the gas mixture, the remainder being essentially hydrogen with a small amount of carbon monoxide.

The solid copper ribbon 43 with the deposited ribbon 47 of polycrystalline diamond particles thereon is then carried to a third position 48 relative to the axis of the rotating drum (such as at a position of about nine o'clock) where the substrate is heated to its melting temperature (50°-300° in excess of the chemical vapor deposition temperature) by another heater 49 (powered by supply 62) facilitating immediate disadherence of the substrate ribbon 43 from the diamond particles and Permitting the fluidized substrate material to drip at 50 (emigrate) into a collecting tube 51 for immediate return to the molten supply of substrate material from which this process started. The now free-standing ribbon 52 of diamond is encouraged to be separated by a mechanical tongue 53 so as to be appropriately segregated or coiled as a film for ultimate use to be subsequently assembled or fabricated onto some component.

As shown in FIG. 5, the rotating drum 35 may have defined therein a trough 54 in its outer surface 55 to contain the molten substrate material as it is introduced to the drum for chilling. The depth of the trough determines the thickness of the meltable substrate material; such trough depth should be preferably in the range of $\frac{1}{8}$-$\frac{1}{4}$ inch.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

What is claimed:

1. A method of fabricating free-standing diamond films, comprising
   (a) depositing and adhering polycrystalline diamond film by hot filament chemical vapor deposition onto a substrate meltable at a temperature slightly in excess of the deposition temperature; and
   (b) prior to cooling said polycrystalline diamond films, increasing the substrate temperature by conductance heating to melt at least a portion thereof while permitting such melt to emigrate from the diamond films.

2. The method as in claim 1, in which step (a) is carried out at a diamond film deposition rate in the range of 2-5 microns per hour.

3. The method as in claim 1, in which said hot filament chemical vapor deposition is carried out with a hot filament at a temperature greater than 1900° C., supplied by an alternating current without electrical bias and spaced from the substrate a distance in the range of 3/16 inch, plus or minus 1/16 inch, the substrate being heated to a temperature in the range of 600°-950° C., and the carbon carrying gas and hydrogen mixture for said chemical vapor deposition being introduced at a rate of 100-200 sccm.

4. The method as in claim 3, in which the gas mixture for said hot filament chemical vapor deposition is comprised of a carbon carrying gas selected from the group consisting of methane, acetylene, and methanol, said selected gas being present in the gas mixture in an amount of 0.2-2% by volume and the remainder of said gas being hydrogen and a small amount of carbon monoxide.

5. The method as in claim 4, in which the carbon monoxide is present in said gas mixture in an amount so that the ratio of oxygen to carbon is restricted to 0.5-1.0.

6. The method as in claim 5, in which the hot filament chemical vapor deposition step is carried out within a time period of three minutes to four hours.

7. The method as in claim 1, in which the substrate material is selected to have a melting temperature which is 50°-300° C. in excess of the chemical vapor deposition temperature of said substrate.

8. The method as in claim 1, in which the substrate material is selected from the group consisting of copper, gold, beryllium, manganese, aluminum/iron, aluminum/copper, and nickel/tin, and from nonmetals $Al_2F_3$, $CdF_2$, $CrF_2$.

9. The method as in claim 1, in which step (b) is carried out within a time period of five minutes to two hours.

10. A method of fabricating free-standing diamond films, comprising:
 (a) depositing and adhering polycrystalline diamond film by hot filament chemical vapor deposition onto a substrate meltable at a temperature slightly in excess of the deposition temperature; and
 (b) prior to cooling said polycrystalline diamond films, increasing the substrate temperature by conductance heating to melt at least a portion thereof while permitting such melt to emigrate from the diamond films by use of gravity and tilting of the support for the substrate material.

11. A method of fabricating free-standing diamond films, comprising:
 (a) depositing and adhering polycrystalline diamond film by hot filament chemical vapor deposition onto a substrate meltable at a temperature slightly in excess of the deposition temperature; and
 (b) prior to cooling said polycrystalline diamond films, increasing the substrate temperature by conductance heating to melt at least a portion thereof while permitting such melt to emigrate from the diamond films by use of a screen fabric acting as a support thereof, which screen support absorbs the melt by capillary action during step (b), said screen being constituted of a material having a higher melting temperature than said substrate material.

* * * * *